Figure 1A:
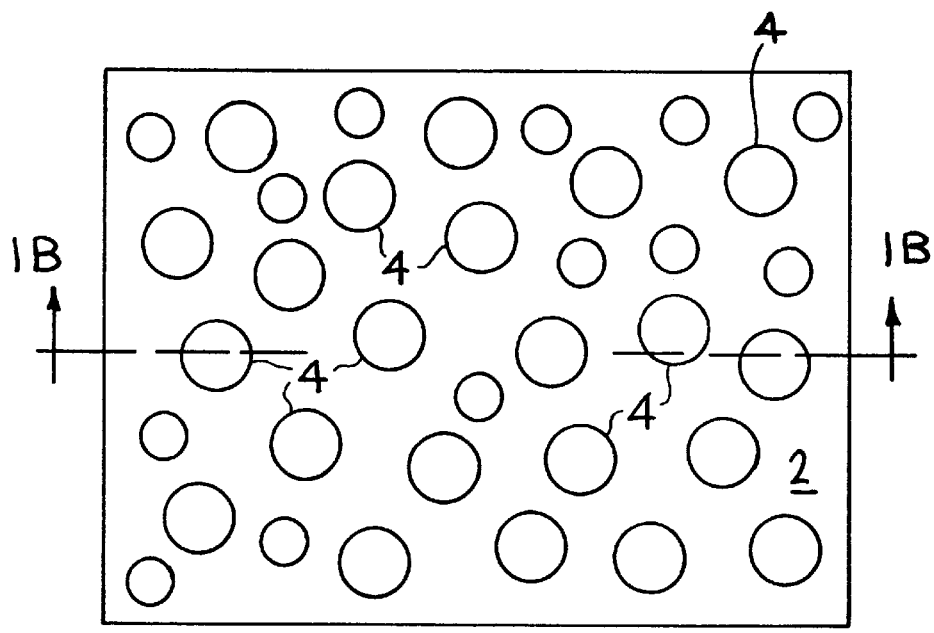

United States Patent [19]
Bernardi et al.

[11] Patent Number: 5,882,436
[45] Date of Patent: Mar. 16, 1999

[54] GIANT MAGNETORESISTIVE HETEROGENEOUS ALLOYS AND METHOD OF MAKING SAME

[75] Inventors: Johannes J. Bernardi, Berkeley; Gareth Thomas, Oakland; Andreas R. Huetten, Berkeley, all of Calif.

[73] Assignee: The Regents of the University of California, Oakland, Calif.

[21] Appl. No.: 978,436

[22] Filed: Nov. 25, 1997

Related U.S. Application Data

[62] Division of Ser. No. 526,745, Sep. 1, 1995.
[51] Int. Cl.$^6$ .................................................. H01F 1/03
[52] U.S. Cl. .................................. 148/100; 148/121
[58] Field of Search .................................. 148/101, 100, 148/121, 430; 420/512

[56] References Cited

PUBLICATIONS

Kuan et al., Chemical Abstract Accession No. 1981:630416, Negative Magnetoresistivity of a Rapidly Quenched Superconduscting Alloy Aluminum–11.3 at% Silicon, Wuli Xuebao (1981) 30(9) pp. 1284–1286, 1981.

Xiao et al., Chemical Abstracts Accession No. 1993:418375, A Study of Indium Antimonide–Nickel Monoantimonide Magnetoresistance Material, Sens. Actuators, A (1993), 35(3), 373–377, 1983.

*Primary Examiner*—John Sheehan
*Attorney, Agent, or Firm*—Paul R. Martin; Henry P. Scartorio; David J. Aston

[57] ABSTRACT

The inventive material exhibits giant magnetoresistance upon application of an external magnetic field at room temperature. The hysteresis is minimal. The inventive material has a magnetic phase formed by eutectic decomposition. The bulk material comprises a plurality of regions characterized by a) the presence of magnetic lamellae wherein the lamellae are separated by a distance smaller than the mean free path of the conduction electrons, and b) a matrix composition having nonmagnetic properties that is interposed between the lamellae within the regions. The inventive, rapidly quenched, eutectic alloys form microstructure lamellae having antiparallel antiferromagnetic coupling and give rise to GMR properties. The inventive materials made according to the inventive process yielded commercially acceptable quantities and timeframes. Annealing destroyed the microstructure lamellae and the GMR effect. Noneutectic alloys did not exhibit the antiparallel microstructure lamellae and did not possess GMR properties.

23 Claims, 5 Drawing Sheets

GIANT MAGNETORESISTIVE HETEROGENEOUS ALLOYS AND METHOD OF MAKING SAME

This a divisional of copending application Ser. No. 08/526,745 filed on Sep. 01, 1995.

This invention was made with U.S. Government support under Contract No. DE-AC03-76SF00098 between the U.S. Department of Energy and the University of California for the operation of Lawrence Berkeley Laboratory. The U.S. Government may have certain rights in this invention.

I. BACKGROUND OF THE INVENTION

1. Field of the Invention

This invention relates generally to a material that has giant magnetoresistance properties and a method for making the material. Materials exhibiting giant magnetoresistant effect are being investigated for use in read heads for high-density magnetic recording and other applications requiring small magnetic sensors that are more sensitive than conventional permalloy heads.

2. Description of Related Art

Magnetoresistance is the change in electrical resistance of a material under the influence of a magnetic field (McGraw-Hill Encyclopedia of Science and Technology, 7th ed. (McGraw-Hill: New York, 1992). In 1988, the magnetoresistance of certain preparations of alternating layers of magnetic and nonmagnetic superlatices was found to be very large and were termed "Giant Magnetoresistance". For example, the resistivity of superlattices of iron and chromium, when there is antiparallel coupling or antiferromagnetic coupling between adjoining iron layers 30 Å thick separated by 9 Å chromium layers and no external magnetic field, was lowered by almost a factor of 2 when a magnetic field of 2 Tesla (T) was applied at a temperature of 4.2 K. Typically about 30 bilayers were grown by molecular beam epitaxy (*Giant Magnetoresistance of* (001)Fe/(001)Cr *Magnetic Superlattices*, Baibich, M. N. et al., Phys. Rev. Let. 61(21): 2472, Nov. 21, 1988. Preparation of giant magnetoresistant (GMR) material by use of molecular beam epitaxy methods is too costly and too slow to be useful for commercial applications. The practical utility of GMR in antiferromagnetic coupled multilayer materials was further limited by the large magnetic fields (2–4 T) required to exhibit the effect.

The GMR mechanism appears to be based on spin-dependent scattering of the conduction electrons within the magnetic particles and, more importantly for GMR, at the interfaces between magnetic particle and the nonmagnetic metal matrix. The magnitude of the GMR effect is expressed as $\Delta R/R_{sat} \equiv [(R_{H-0} - R_{H-sat})/R_{H-sat}] \times 100\%$. When the material is layered, the resistance change is further proportional to the cosine of the angle between the magnetization directions of the alternate layers. Generally, the GMR effect has been observed to decrease as the temperature of the sample at the time of measurement increased. [McGraw-Hill *Yearbook of Science & Technology*, 1995 (McGraw-Hill: New York)].

For antiferromagnetically coupled multilayers, the sensitivity to magnetic fields is two orders of magnitude smaller than that of currently used anisotropic magnetoresistance (AMR) thin-film sensors. The resistance change of AMR sensors is 2% at room temperature in a 5 Oe field while the GMR antiferromagnetically coupled multilayers require a magnetic field of about 1 or 2 T to change resistance.

In 1992 two groups of researchers observed GMR in granular, inhomogeneous alloys of copper/cobalt (*Giant Magnetoresistance in Heterogeneous Cu—Co Alloys*, A.E. Berkowitz, et al., Phys. Rev. Let. 68(25): 3745, Jun. 22, 1992; J. Q. Xiao, et al., Phys. Rev. Let. 68(25): 3749 Jun. 22, 1992). In granular GMR materials small fields were sufficient to align the ferromagnetic particles. The GMR effect was observed at magnetic field magnitudes of the order of 5,000 Oersted (Oe) instead of 10,000 kiloOersted (kOe). Observing that the GMR in multilayered structures comes from the reorientation of single domain magnetic layers, compounds were formed that contained single domain magnetic particles (such as cobalt) in a nonferromagnetic matrix. In an alloy having a significant volume fraction of single domain magnetic particles, the magnetic orientation of the particles is random at the coercive magnetic field; there are many particles that are statistically arranged antiparallel or less, so that a smaller applied magnetic field produces GMR. Thus it became possible to make materials having GMR properties at fields of 5 kOe and less. In a granular, inhomogeneous material, the magnitude of the GMR effect is controlled by the volume fraction of magnetic particles in the material, the magnetic particle size, the magnetic particle density, interface roughness, and impurities in the nonmagnetic metallic matrix.

GMR materials have in the past been constructed using sputtering, sputtering from a single composite target, evaporation, metal pastes, mechanically combining the magnetic and nonmagnetic materials, or implanting the magnetic materials (in the form of ions) into the nonmagnetic matrix. All of these methods are too costly in terms of equipment required, labor effort, and fabrication time, to be commercially useful.

It would be very desirable to be able to make a material that exhibited GMR properties at room temperature in a magnetic field of 5 kOe or less for a reasonable cost.

II. SUMMARY OF THE INVENTION

It is an object of the invention to provide a material having measurable GMR properties for applied magnetic fields of 5 kOe or less at room temperature. It is a further object of this invention to provide a practical and inexpensive mass production method for the GMR material.

The inventive material exhibits giant magnetoresistance upon application of an external magnetic field at room temperature. The hysteresis is minimal. The inventive material has a magnetic phase formed by eutectic decomposition. The bulk material comprises a plurality of regions characterized by a) the presence of magnetic lamellae wherein the lamellae are separated by a distance smaller than the mean free path of the conduction electrons; and b) a matrix composition having nonmagnetic properties that is interposed between the lamellae within the regions.

The inventive material is made by a process that yields, for example, about 2 grams of material 50 times or more faster than current methods require to yield about a tenth of that amount. Workers of ordinary skill in the art can optimize the equipment parameters to yield much larger amounts of material in a short fabrication time.

III. SUMMARY DESCRIPTION OF THE DRAWINGS

FIG. 1A: shows a bulk material with some grains having average diameter of about 1 micrometer ($\mu$m).

Figure 1C:
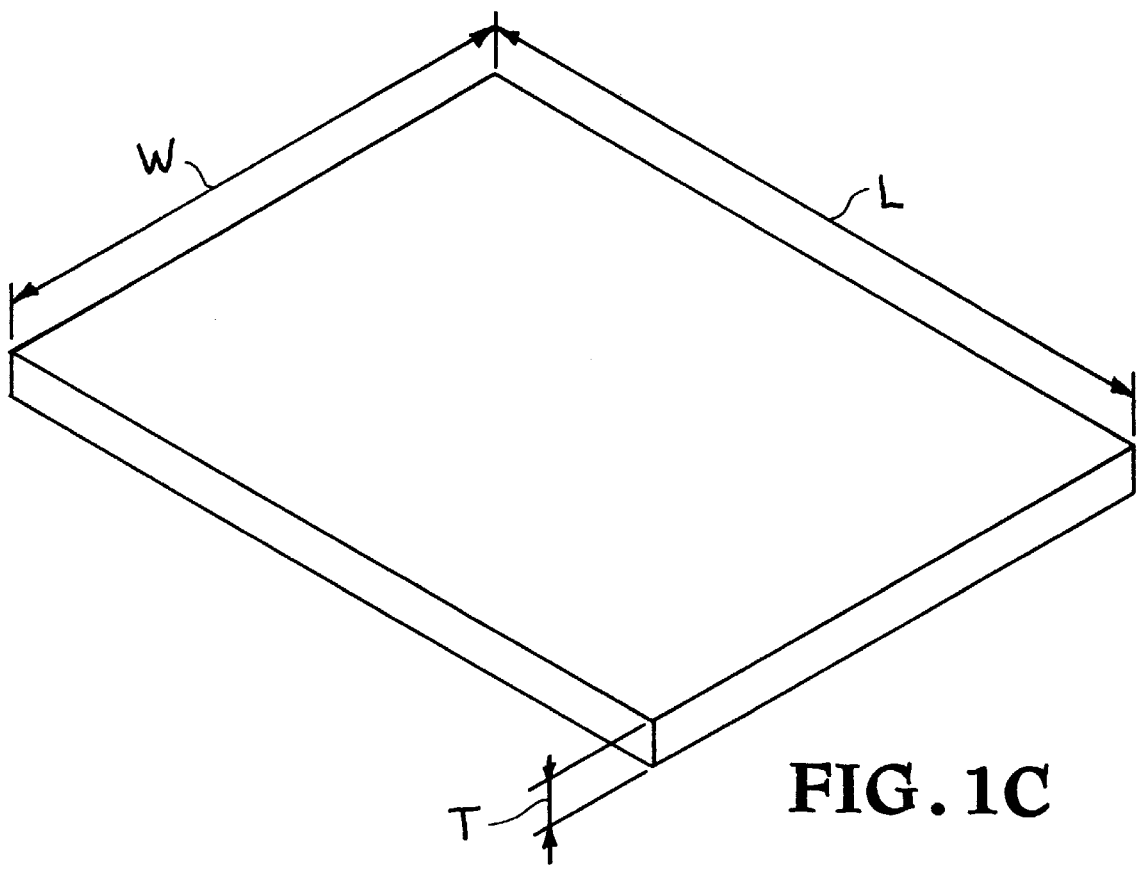
Figure 1B:
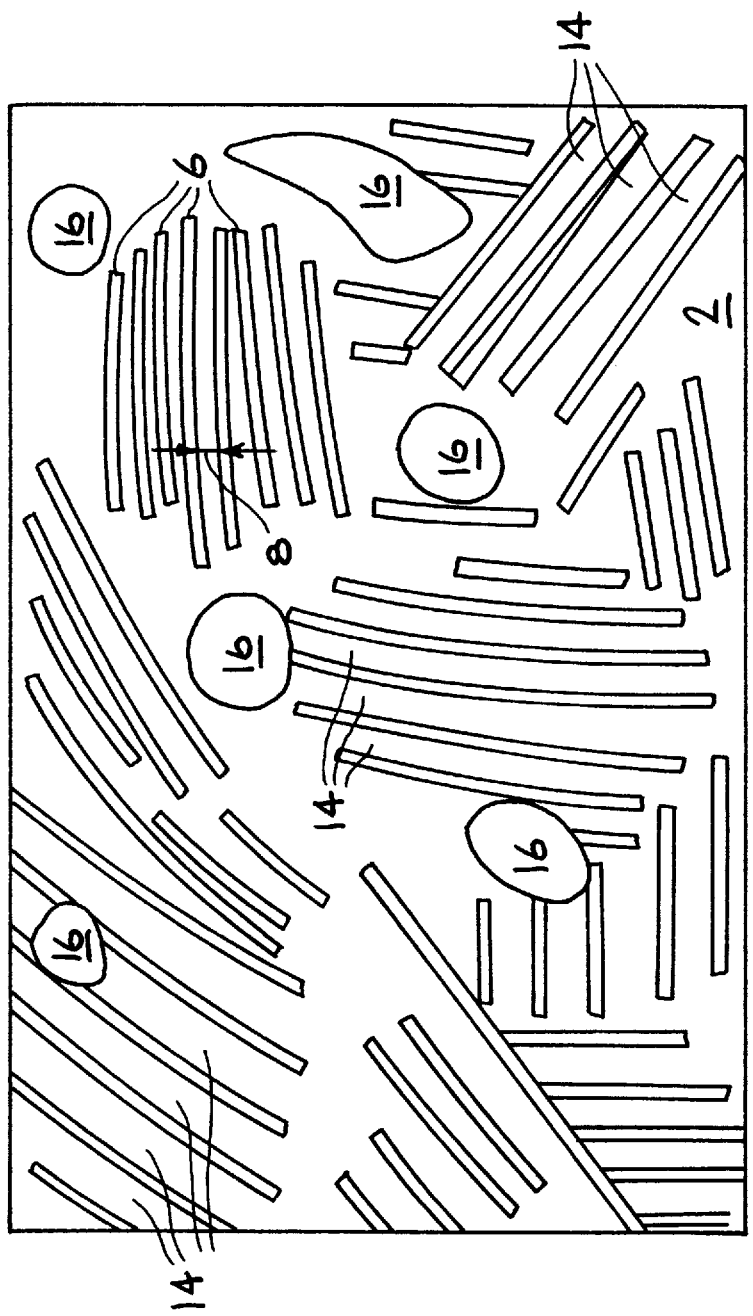

FIG. 1B: shows a schematic cross-sectional representation of the grains which contain lamellar-like structures.

FIG. 1C: shows an idealized schematic diagram of one lamella, having length, l, width, w, and thickness, t.

Figure 2:
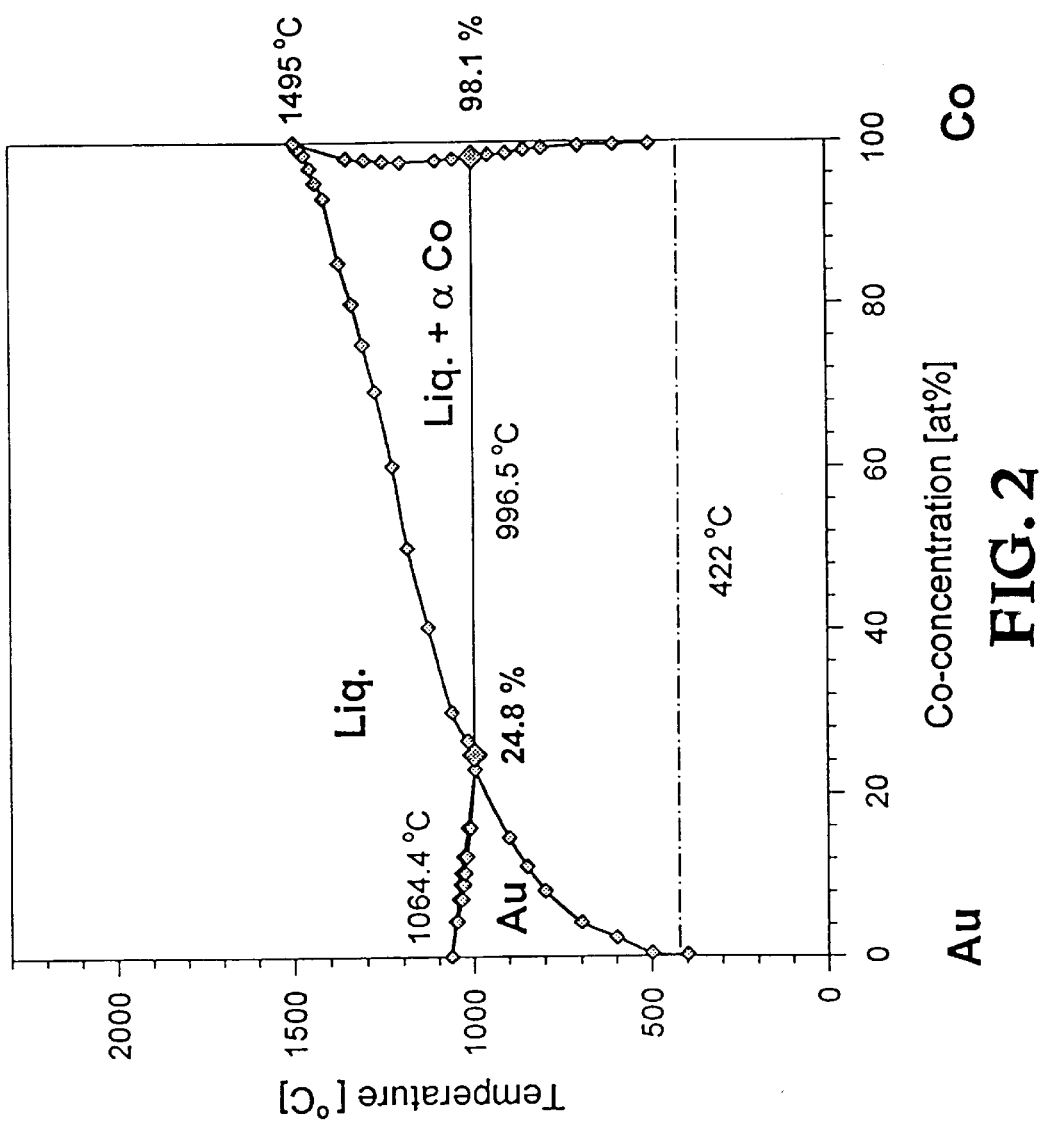

FIG. 2: shows an equilibrium phase diagram of gold-cobalt.

FIGS. 3A, B: show saturation magnetization and remanence, measured along the left-hand ordinate, and coercivity measured along the right-hand ordinate as a function of annealing time for melt-spun $gold_{93.5}$-$cobalt_{6.5}$ and $gold_{71.6}$-$cobalt_{28.4}$ specimens.

Figure 4:
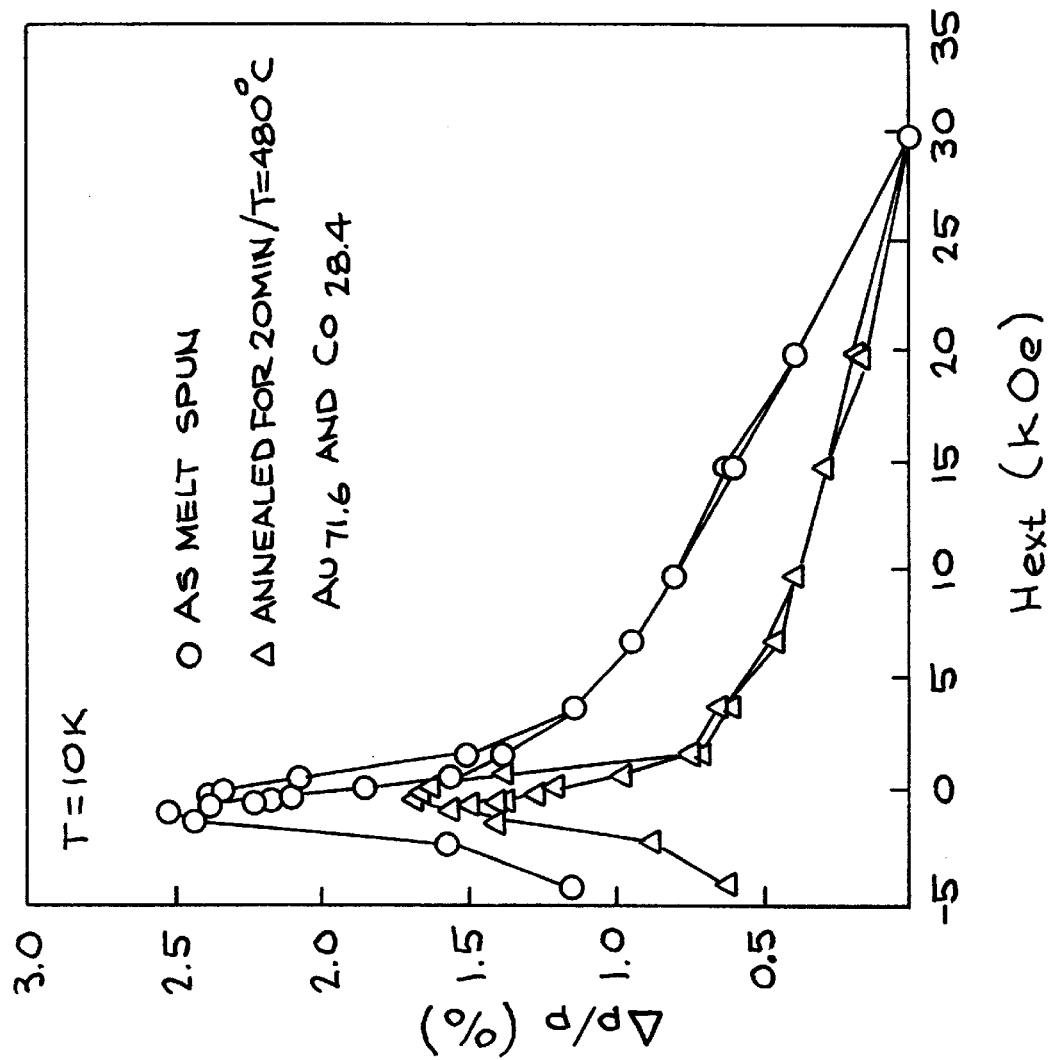

FIG. 4: shows GMR behavior of as-quenched and annealed $gold_{71.6}$-$cobalt_{28.4}$ specimens.

IV. DETAILED DESCRIPTION OF THE INVENTION

The term "grain" in this document means a region having interleaved magnetic and nonmagnetic lamellae formed by a eutectic decomposition during solidification.

The term "nonmagnetic" in this document means nonferromagnetic, diamagnetic or weakly magnetic.

The term "magnetic" in this document means ferromagnetic.

The abbreviation "GMR" means giant magnetoresistance.

The symbol "Z" means atomic weight.

The symbol "$\lambda$" means the distance between lamellae.

The symbol "$\lambda_e$" means the mean free path of an electron.

FIG. 1A shows a bulk material 2 with inhomogeneous grains 4 having average diameter of about 1 micrometer ($\mu$m). The bulk material exhibits GMR upon application of an external magnetic field at room temperature. FIG. 1B shows a schematic crossection of FIG. 1A illustrating an inhomogeneous interior of the grains 4. The grains comprise regions characterized by the presence of magnetic lamellae 6 wherein the lamellae are separated by a distance 8 smaller than the mean free path of the conduction electrons. A matrix composition having nonmagnetic properties is interposed between the lamellae within the regions 14. The grains typically exhibit a well defined crystal structure and orientation. Some particles 16 of the magnetic material precipitate during formation of the inventive GMR material. The extent to which these form depends to some extent on the concentration of the alloy components prior to cooling and on the temperature conditions.

The ideal grain size is large enough to avoid becoming paramagnetic at room temperature and small enough that the grain does not contain multiple domains. An actual sample contains grains of various sizes and some are smaller than or larger than the ideal size. However, the average grain size in the inventive sample should fit within the size limitations just described.

The lamellae found within the grains have dimensions that can be characterized by length, width, and thickness, illustrated in FIG. 1C. The length has been found to vary from about 1 $\mu$m to about 1.5 $\mu$m. It can, however range from about 10 nm to as large as about 10 $\mu$m. The width has been found to vary from about 20 nm to about 50 nm. It can, however range from about 10 nm to about 200 nm. The thickness has been found to vary from about 8 nm to about 12 nm. It can, however range from about 5 nm to about 20 nm.

It is believed that the Au—Co eutectic alloy provides a dense arrangement of Co particles and Co lamellae wherein the distance between Co formations is smaller than the mean free path of conduction electrons. The GMR mechanism appears to be based on spin-dependent scattering of the conduction electrons at the interfaces of the magnetic and nonmagnetic material. Thus the high volume percent of surface interface associated with lamellae structure in the grains enhances GMR in the inventive material.

The random orientation of the lamellae-containing grains gives rise to GMR effects under conditions of lower external magnetic field than for conventional antiferromagnetic coupled multilayers.

The preferred magnetic material of this invention comprises high purity cobalt. The purity of the cobalt should be 99.9% or greater. As the purity of the starting cobalt increases, the reproducibility of the GMR properties of the final material increases. Preferably the cobalt is combined in an alloy with gold in eutectic proportions, that is, 25% cobalt and 75% gold. Up to 50% of the cobalt fraction may, however, be substituted with another metal that is miscible in cobalt, preferably a ferromagnetic material such as iron, or nickel. As the percent of cobalt is discussed below, it is understood that this substitution may take place although it is not preferable because the GMR performance of the resulting material will decrease as the proportion of substituted material is increased.

The preferred nonmagnetic material of this invention comprises high purity gold. The purity of the gold should be 99.9% or greater. As the purity of the starting gold increases, the reproducibility of the GMR properties of the final material increases. Preferably the gold is combined in an alloy with gold in eutectic proportions, that is, 25% cobalt and 75% gold. Up to 50% of the gold fraction may, however, be substituted with another metal that is miscible in gold, preferably a nonmagnetic material such as copper or chromium. As the percent gold is discussed below, it is understood that this substitution may take place although it is not preferable because the GMR performance of the final material will decrease as the proportion of substituted material is increased.

The inventive material is formed from a liquid phase eutectic alloy of magnetic and nonmagnetic materials. Starting alloys are subjected to arc-melting, or any of many known methods to heat and cool the mixture repeatedly thus ensuring homogeneous starting alloys. The initial concentration of alloy components is the eutectic concentration +20% or −10%. The initial temperature of the alloy is higher than the temperature of the eutectic point. The alloy is quenched rapidly to room temperature. Quenching must be rapid enough to prevent dissolution of the eutectic structure during cooling. Rapid quenching freezes the eutectic structure. If quenching is too slow, the eutectic is partly dissolved and larger cobalt particles are formed. This has two undesirable effects: multidomain cobalt particles are formed, and a larger distance between ferromagnetic particles is created. The interface structure between ferromagnetic and nonmagnetic materials, so important for GMR, may also change. Rapid quenching is achieved by any of a number of conventional methods including, but not limited to, spin cooling on a wheel, splat cooling, and gas atomization.

When the eutectic alloy is quenched by melt spinning, the wheel velocity should be chosen to be rapid enough to prevent dissolution of the eutectic structure during cooling. It was found that a quenching rate of at least about $10^4$ K/sec worked well. The melt spin method of preparing the inventive GMR material yields much larger amounts of material exhibiting GMR properties than other methods of preparation. When quenching a eutectic alloy by melt spinning, a ribbon of about 1.5–2 mm by 10–50 $\mu$m by about 2–5 cm, comprising between about 2 and about 5 grams can be formed from the hot eutectic solution in a matter of seconds. In contrast, using other methods of preparing GMR material requires hours to produce a much smaller, for example, only one tenth the amount of material.

A further advantage of the inventive method to produce alloys exhibiting GMR is that no annealing is required.

Annealing at moderate temperatures may improve the GMR properties of the final material. The temperature may be between about 150° C. and about 400° C. The higher the temperature, the shorter the annealing time will be. For example, if an annealing temperature of 150° C. is chosen, the annealing time may be as long as 10 hours. In contrast if the material is annealed at 400° C., the annealing time may be as short as 2 or 5 or 10 minutes. Another example would be an annealing temperature of about 200° C. and an annealing time between about ½ hour and about 1 hour. It is also possible to combine some time at the lower temperatures with a shorter time at the higher temperatures.

EXAMPLE: Gold Cobalt Alloy

Recent studies of GMR in Au—Co [J. A. Barnard, M. R. Parker, D. Seale and J. Yang, *IEEE Trans. Mag.*, 29, 2711 (1993).; R. von Helmolt, J. Wecker and K. Samwer, *App. Phys. Lett.*, 64, 791 (1994)] found relatively low GMR-values, however, using the inventive method presented here, commercially acceptable quantities of Au—Co GMR material were obtained. The material was fabricated using the inventive rapid quenching of a eutectic alloy, demonstrated high GMR. The GMR properties of the material obtained is improved by optimizing nominal composition of the alloy and quenching rate during melt-spinning. FIG. 1B shows a schematic cross-sectional representation of the grains which contain lamellar-like structures in $gold_{71.6}$-$cobalt_{28.4}$ specimens. Cobalt precipitates up to about 100 nm may be formed heterogeneously at grain boundaries during cooling.

The equilibrium phase diagram of gold and cobalt (Au—Co) is shown in FIG. 2. It can be seen form the left side of the phase diagram, at 0% cobalt concentration, that the face-centered cubic (fcc) Au component with $a_0$=0.4079 nm melts at 1064° C. and shows no allotropy. The right vertical axis shows that the fcc Co component with $a_0$=0.3545 nm melts at 1495° C.) [P. Villors and L. D. Calvet, *'Pearson's Handbook of crystallographic data for intermetallic phases's*, vol. 2, ASM International (1985) .6] and transforms into a hexagonal-closed-packed (hcp) structure with $a_0$=0.2507 nm and $c_0$=0.4070 nm below 422° C. The fcc structure is associated with a negative anisotropy constant, K1. The hcp structure is associated with a positive K1. The Au—Co phase diagram is characterized by a eutectic at $c_{eu}$(Co)=24.8 at % and $T_{eu}$=996.5° C., where the high-temperature fcc solid solution $Au_{77}Co_{23}$ is in equilibrium with the Co-rich high-temperature fcc solid solution $Au_{1.9}Co_{98.1}$. The solubility of Co in Au and Au in Co below 422° C. is very limited and much smaller than 0.2 at % [H. Okamoto, T. B. Massalski, M. Hasebe and T. Nishizawa, *Bulletin of Alloy Phase Diagrams*, 6:449 (1985)]. Hence, a homogeneous $Au_{100-x}Co_x$ alloy quenched from above the miscibility gap essentially decomposed into its pure Au and Co components during annealing at temperatures below 422° C. Using given experimentally determined solubility data (see Okamoto, above), a linear fit between 400° C. and 500° C. yields the equilibrium solubility of Co atoms in the Au matrix to be $c_e$=0.36 at % and the equilibrium Co concentration of Co precipitates to be $c_p$=99.72 at % at 480° C.

Synthesis

Three grams each of $Au_{95}Co_5$ and $Au_{75}Co_{25}$ alloys were prepared by arc-melting high-purity Au and Co. To ensure homogeneous starting alloys, arc-melting was repeated six times for each alloy. Subsequently, melt-spinning was performed at a system base pressure of about $9 \times 10^{-6}$ mbar using a vertical outer peripheral melt-spinner. During that process each alloy charge was induction-melted in a boron nitride nozzle crucible. By applying an argon pressure of 0.5 bar the melt was ejected onto the surface of a polished Cu wheel running at 63 m/s, and ribbon flakes about 5 cm long, 1–2 mm wide and 25–40 $\mu$m thick were produced. This wheel velocity roughly relates to a quenching rate of about $10^4$ K/s. After synthesis the nominal composition of the ribbons was measured using a JEOL 35CF scanning electron microscope equipped with an ultra-thin window energy dispersive x-ray (EDX) detector. Averaging over compositions taken at 200×200 $\mu m^2$ raster areas in 18 different ribbon flakes for each alloy, the nominal composition of the Au—Co alloys was determined and is given in Table 1, below. The samples were heat treated at 480° C. in argon-filled quartz capsules for 20 min, 1 h, 2.5 h, 5 h and 10 h. Magnetic measurements were performed at room temperature in a vibration sample magnetometer (VSM) in fields up to 20 kOe. The magnetoresistance was measured in a four-point probe geometry in fields up to 55 kOe at 10 K and at room temperature. Prior to microstructural characterization, as-quenched and annealed ribbons were mounted on copper grids and electron transparent thin samples were made in two steps by argon ion-milling at liquid nitrogen temperature: first, by thinning at 4 kV with a total gun current of 1 mA and at an incident angle of 15 degrees, followed by thinning at 2 kV at same gun current with an incident angle between 8–10 degrees. The evolution of the microstructure was observed by transmission electron microscopy (TEM) using a Philips 400 as well as a JEOL 200 CX operating at 120 keV and 200 keV, respectively. Both microscopes were equipped with an ultra-thin Be window EDX detector capable of detecting and accurately quantifying all elements with Z≧6. Spectroscopic spectral deconvolution and quantification were carried out on KEVEX 8000 system software using theoretically generated thin foil K-factors. Statistical significance of the data was ensured acquiring a minimum of $10^5$ counts.

TABLE 1

Composition of starting alloys and melt-spun Au—Co ribbons [at %]

| Starting alloy | Au concentration after melt spin | Co concentration after melt spin | Mean composition after melt spin |
|---|---|---|---|
| $Au_{95}Co_5$ | 93.5 ± 1.6 | 6.5 ± 1.6 | $Au_{93.5}Co_{6.5}$ |
| $Au_{75}Co_{25}$ | 71.6 ± 1.4 | 28.4 ± 1.4 | $Au_{71.6}Co_{28.4}$ |

Magnetoresistance measurements

For comparison, eutectic $Au_{75}Co_{25}$ and noneutectic $Au_{95}Co_5$ alloys were prepared according to methods that were otherwise the same. Each was examined for magnetoresistance properties, transmission electron microscopy (TEM) analysis, and response to annealing regimens. It was found that rapidly quenched eutectic alloys formed a lamellar microstructure that gave rise to GMR properties. These materials were made in commercially acceptable quantities and timeframes. Annealing at 480° C. destroyed the microstructure lamellae and the GMR effect. Noneutectic alloys did not exhibit the microstructure lamellae and did not possess GMR properties.

Figure 3:
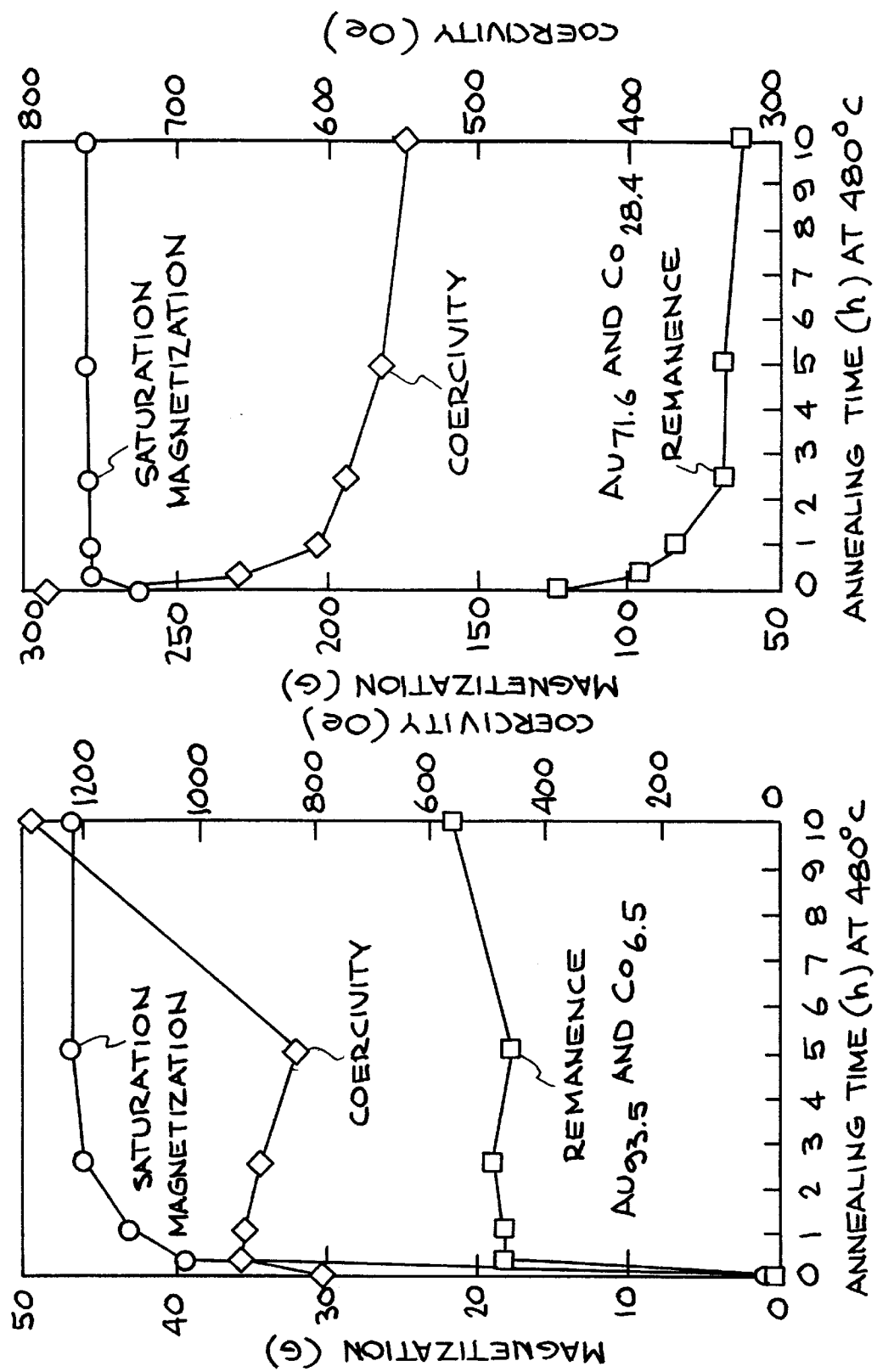

FIG. 3 summarizes the magnetic behavior of melt-spun $Au_{93.5}Co_{6.5}$ and $Au_{71.6}Co_{28.4}$ specimens annealed at 480° C. as a function of annealing time. Whereas there is a strong increase in saturation magnetization ($M_s$) for $Au_{93.5}Co_{6.5}$ samples with increasing annealing time ($t_a$), the change in $M_s$ with increasing $t_a$ for $Au_{71.6}Co_{28.4}$ is relatively small. Since $M_s$ is a measure of the volume fraction of already precipitated ferromagnetic particles it can be concluded that most of the Co atoms of as-quenched $Au_{93.5}Co_{6.5}$ samples are still in solution compared to as-quenched $Au_{71.6}Co_{28.4}$ specimens which should already be decomposed to a certain extent. The degree of decomposition in the as-quenched state for both alloys can be determined by calculating their $M_s$ (equilibrium)=$M_s$ ($t_a \rightarrow \infty$), assuming completely decomposed samples and comparing with the measured values. The calculation of $M_s$ (equilibrium) requires the knowledge of $M_s$ of pure fcc Co and of the equilibrium volume fraction of Co particles at 480° C. The latter can be calculated from the phase diagram given in FIG. 2. The saturation magnetization of fcc Co at 5K is 175 emu/g [J. R. Childress and L. Chien, *Phys. Rev. B*, 43:8089 (1991)]. Assuming the same temperature dependence for $M_s$ (fcc Co) as is measured for $M_s$ (hcp Co), extrapolation to room temperature yields $M_s$ (fcc Co, T=RT)~1507 G, slightly higher than $M_s$ (hcp Co, T=RT)=1447 G [Landolt-Börnstein, '*Magnetic Properties of Metals*', New Series III/19a, 37 (1991)]. Table 2 shows the calculated volume fractions of ferromagnetic particles in as-quenched alloys compared with those of 10 h at 480° C. annealed ones. From these results it can be concluded that as-quenched $Au_{71.6}Co_{28.4}$ samples were already decomposed during melt-spinning, whereas as-quenched $Au_{93.5}Co_{6.5}$ ribbons initially consisted of a solid solution which was subsequently decomposed during annealing.

TABLE 2

Determination of the % of decomposition in melt-spun Au—Co alloys

| alloy composition | $M_S$ (equilibrium) | ferromagnetic particles [vol %] | |
|---|---|---|---|
| [at %] | [G] | as-quenched | 10 h at 480° C. |
| $Au_{95}Co_5$ | 62.1 ± 15.5 | 1.39 ± 0.5 | 80.6 ± 28.5 |
| $Au_{75}Co_{25}$ | 304.5 ± 17.0 | 86.9 ± 6.9 | 92.2 ± 7.3 |

The remanence of $Au_{93.5}Co_{6.5}$ ribbons as well as their coercivity show similar behavior. Remanence and coercivity were increasing up to 20 min annealing. While remanence remained about constant, the coercivity was slightly decreased, but both increased again after 5 h. The opposite tendency was observed for remanence and coercivity of $Au_{71.6}Co_{28.4}$ specimens. Both decrease with increasing annealing time.

The above data demonstrates that rapidly quenched eutectic alloys of magnetic and nonmagnetic composition form alloy exhibiting GMR.

Giant magnetoresistance

There is further experimental evidence that noneutectic samples do not form the lamellae necessary for GMR. $Au_{93.5}Co_{6.5}$ samples were shown to form a single solid solution after quenching as indicated in the shape of the magnetic field dependence of their magnetoresistance measured at 10 K and 300 K. Since the decrease in magnetoresistance with increasing magnetic field did not show any saturation (which would be expected for a GMR material but is a linear function of the increasing external magnetic field at high fields independent of temperature), it can be concluded that the measured effect is only the magnetoresistance (MR) of paramagnetic Co. The fact that $\Delta\rho/\rho$ at RT reached almost zero, as expected for MR of paramagnetic Co, also supports this interpretation. The deviation of the described linear behavior of $\Delta\rho/\rho$ ($H_{ext}$) at low fields can be attributed to the measured 1.4 vol % of already ferromagnetic particles in these alloys. Furthermore, from the shape of $\Delta\rho/\rho$ ($H_{ext}$) for $Au_{93.5}Co_{6.5}$ annealed at 480° C. for 20 min, it can be seen that the MR behavior does not change during annealing.

In contrast, FIG. 4 clearly shows GMR behavior for as-quenched $Au_{71.6}Co_{28.4}$. The broad transition towards saturation can be taken as a hint that there is a fairly wide Co particle size distribution present in these samples. The maximum amplitude of GMR for different samples of as-quenched $Au_{71.6}Co_{28.4}$ measured at 10 K ranged from about 2.4–3.1% and dropped to about 1.4–1.8% at 300 K. The curve shape did not change during annealing, although the GMR amplitude decreased with increasing annealing time, as can be seen from Table 3.

TABLE 3

Evolution of room temperature GMR with annealing time

| Annealing time [h] | Dr/r [%] |
|---|---|
| 0 (as quenched) | 1.81 |
| 1.00 | 0.69 |
| 2.50 | 0.50 |

It is an advantage of the present invention that annealing is not necessary, though quenching at moderate temperatures for appropriate times may affect the interface between magnetic and nonmagnetic materials positively.

Microstructural evolution during isothermal annealing at 480° C.

The results of the magnetic measurements for as-quenched samples of both alloy compositions were clearly confirmed by microstructural characterization. Except for dislocations in as-quenched $A_{93.5}Co_{6.5}$, which were most likely formed during quenching as a consequence of thermal stresses due to the presence of a temperature gradient across the ribbon thickness, no evidence for precipitates of a second phase was found. This explains the weak ferromagnetic behavior of these samples. In comparison, as-quenched $Au_{71.6}Co_{28.4}$ specimens, were already decomposed forming a lamellar eutectic which is aligned in the <011>direction. The average Co-rich lamella is (7.6±1.3) nm wide, whereas the Au-rich lamella is (23.9±7) nm across. The interlamellar spacing $\lambda$=(30.9±5.8) nm relates to a total of $(2/\lambda)=0.65\times10^8$ $m^2$ of Au-rich/Co-rich interface per $m^3$ of eutectic. In addition, the microstructure of as-quenched $Au_{71.6}Co_{28.4}$ specimens is characterized by a high density of Co precipitates of about 80 nm in diameter located at grain boundaries. This lamellar eutectic with almost pure Co as one component is very promising as a means of achieving multilayered structures similar to those obtained by employing thin films deposition techniques. Details about the influence of nominal composition on lamellar spacing and composition of the eutectic will be discussed elsewhere (Bernardi, J. Et al., TEM Investigation of Multilayered Structures, Phys. Stat. Sol. (A) 147:165 (1995). During annealing of as-quenched $Au_{93.5}Co_{6.5}$ samples for 20 min at 480° C., small precipitates shaped like oblate spheroids were formed with c of about 6 nm and c/a of about 4. Their c-axes were aligned in <001>. Beside these particles larger precipitates of about 20 nm were heterogeneously formed at dislocation. Further annealing up to 1 h destroyed the orientation relationship between the matrix and the small precipitates, which tended to be more spherical. Whether these particles are coherent, semicoherent or incoherent has yet to be clarified by high resolution microscopy, but is not a major issue for magnetic behavior. Co particles initially nucleated at dislocations grew up to about 50 nm diameter, and large Co particles of about 50 nm heterogeneously formed at grain boundaries can be seen. Since their shape is not symmetrical to the grain boundary it can be concluded that all the involved Au-matrix/Coprecipitate interfaces were not the same energetically, which would either indicate the presence of local concentration gradients or the presence of semi- and incoherent interfaces. A sample annealed for 10 hours gave rise to large Co particles of about 20–100 nm within the matrix grains. Particles at grain boundaries were still between 20–80 nm and hence did not show significant coarsening. This could indicate that the main contribution to decomposition at shorter annealing times was of heterogeneous and incoherent type.

During annealing of as-quenched $Au_{71.6}Co_{28.4}$ for 1 h at 480° C., the lamellar eutectic was dissolved in favor of the formation of large Co particles $\leq 200$ nm at grain boundaries or within the grains by draining off Co atoms from initially Co-rich lamellas, leaving behind Co-rich oblate spheroids. Simultaneously the formation of smaller particles $\leq 10$ nm within the matrix grains was observed. Samples annealed for 5 h at 480° C. consist of large Co particles $\leq 100$ nm within matrix grains very large Co particles at grain boundaries, and small Co precipitates in matrix grains.

As-quenched $Au_{71.6}Co_{28.4}$ specimens formed large heterogeneous precipitates at grain boundaries and a eutectic structure within the grains. During the first hour during annealing of these samples was therefore characterized by dissolving the lamellar eutectic in favor of the coarsening of particles located at the grain boundaries. After 1 hour of annealing, coherent precipitates were observed within the grains. Further annealing led to coarsening of the remainder of the initial eutectic structure and of the smaller particles and reduced the GMR properties of the material.

Phenomenological modeling of GMR [S. Zhang, *Appl. Phys. Lett.*, 61:1855 (1992)] relates its magnitude in general to spin-dependent scattering of conduction electrons as the underlying physical mechanism. Spin-dependent scattering occurs within ferromagnetic layers of thin film multilayer structures, case (I), or within ferromagnetic particles in heterogeneous alloys, case (II), as well as at interfaces between ferromagnetic and nonmagnetic layers in case (I), or at interfaces between ferromagnetic particles and nonmagnetic matrix in case (II). Furthermore, there is considerable evidence that the interfacial scattering is the dominant contribution to GMR. Hence the amplitude of GMR in decomposed alloys is mainly determined by the scattering probability of conduction electrons at interfaces between ferromagnetic particles and the nonmagnetic matrix. This probability is non zero only when the mean-free path of the electrons is comparable to interparticle distance and particle diameter itself. For the following discussion the RT mean-free path in pure Au of $\lambda_e \sim 40$ nm [N. W. Ashcroft and N. D. Mermin, '*Solid State Physics*', Holt, Rinehart and Winston (1976)] is used as an upper limit for the mean-free path for inelastic scattering of the conduction electrons in Au-Co.

The visibility of Co precipitates by mass contrast in the TEM makes it possible to correlate magnetic and GMR properties with the microstructure of the as-quenched and subsequently annealed $Au_{1-x}Co_x$ alloys prepared by melt spinning. The GMR effect in these heterogeneous alloys is determined by Co particle size distribution and interparticle distance The observed particle size distribution of $Au_{93.5}Co_{6.5}$ is of a bimodal type. Small Co particles are incoherently formed within Au matrix grains whereas large particles are due to heterogeneous nucleation at dislocations and grain boundaries. Most of the small Co precipitates are below the critical diameter for superparamagnetic behavior, even at low temperatures. Hence this microstructure does not fulfill the requirements for GMR and a MR effect was observed only.

The GMR effect observed in the inventive, rapidly quenched formation of $Au_{71.6}Co_{28.4}$, is a maximum for as-quenched samples and can clearly be attributed to the presence of the lamellar eutectic consisting of almost pure Au and Co lamellas. It is characterized by $0.65 \times 10^8$ $m^2$ of interface per $m^3$ between ferromagnetic Co lamellas, which are statistically arranged antiparallel. Furthermore, the mean interlamellar spacing $\lambda \leq \lambda_s$, which corresponds to a high possibility for interfacial scattering. No annealing is necessary in these samples to produce a GMR effect.

The present invention provides a rapidly-quenched eutectic alloy of magnetic and nonmagnetic composition. The magnetic and nonmagnetic components form microstructure lamellae in randomly oriented grains that exhibit GMR at commercially acceptable levels. The spacing and structural details of the lamellae can be optimized for a given material by varying the quench rate and the starting percent composition within a small percent of the eutectic amounts. In Au—Co, it has been demonstrated that a multilayered structure synthesized using rapid quenching and thin film melt-spun techniques can be also achieved in bulk specimens. The maximum amplitude of the GMR effect in $Au_{73.5}Co_{28.4}$ samples correlates to the interlamellar spacing of the eutectic, which can be optimized by on of ordinary skill in the art.

The description of illustrative embodiments and best modes of the present invention is not intended to limit the escope of the invention. Various modifications, alternative constructions and equivalents may be employed without departing from the true spirit and scope of the appended claims.

Having thus described the invention, what is claimed is:

1. A method for producing a bulk material that exhibits giant magnetoresistance upon application of an external magnetic field comprising the steps of, a) raising the temperature of a eutectic alloy of magnetic and nonmagnetic components to a temperature that exceeds the eutectic temperature; and b) rapidly quenching the alloy to room temperature at a rate fast enough to prohibit dissolution of the eutectic structure during cooling.

2. The method of claim 1 wherein the eutectic alloy comprises gold and cobalt.

3. The method of claim 2 wherein the purity of the gold is at least 99.9%.

4. The method of claim 3 wherein the purity of the cobalt is at least 99.9%.

5. The method of claim 2 wherein the gold fraction of the alloy comprises gold and between 50% and 0.0001% of another nonmagnetic material that is miscible in gold.

6. The method of claim 2 wherein the cobalt fraction of the alloy comprises cobalt and between 50% and 0.0001% of another magnetic material that is miscible in cobalt.

7. The method of claim 1 wherein the rapid quenching is between about 3,000 K per second and about 60,000 K per second.

8. The method of claim 7 wherein the rapid quenching is between about 5,000 K per second and about 30,000 K per second.

9. The method of claim 8 wherein the rapid quenching is between about 8,000 K per second and about 15,000 K per second.

10. The method of claim 1 wherein the rapid quenching is performed by melt spinning.

11. The method of claim 1 preceded by homogenization of the alloy.

12. The method of claim 1 further comprising annealing the rapidly quenched material.

13. The method of claim 12 wherein the annealing is performed at a temperature between about 150° C. and about 400° C.

14. The method of claim 13 wherein the annealing is performed by placing the material at the annealing temperature for between about 2 minutes and about 100 hours.

15. A method for producing bulk gold-cobalt material that exhibits giant magnetoresistance upon application of an external magnetic field, comprising the steps of,
   a) arc-melting gold and cobalt to form an alloy comprising proportions of gold and cobalt between about $Au_{65}Co_{35}$ and about $Au_{85}Co_{15}$;
   b) induction melting each alloy charge in a boron nitride nozzle crucible;
   c) applying a pressure using an inert gas to eject the melt onto the surface of a polished copper wheel running so as to quench at a rate of about 10,000 K per second.

16. The method of claim 15 wherein the purity of the starting gold is greater than 99.9%.

17. The method of claim 16 wherein the purity of the starting cobalt is greater than 99.9%.

18. The method of claim 15 wherein the arc-melting is repeated between two and twenty times.

19. The method of claim 18 wherein the arc-melting is repeated between 4 and 10 times.

20. The method of claim 15 wherein the inert gas is chosen from Ar and He.

21. The method of claim 15 wherein the applied pressure is 0.5 bar.

22. The method of claim 15 wherein the melt-spinning is performed in a system base pressure of about $9 \times 10^{-6}$ mbar using a vertical outer peripheral melt spinner.

23. A method for producing bulk gold-cobalt material that exhibits giant magnetoresistance upon application of an external magnetic field, comprising:
   a) arc-melting gold and cobalt to form an alloy comprising proportions of gold and cobalt between about $Au_{65}Co_{35}$ and about $Au_{85}Co_{15}$;
   b) induction melting each alloy charge in a boron nitride nozzle crucible;
   c) applying a vacuum to eject the melt onto the surface of a polished copper wheel running so as to quench at a rate of about 10,000 K per second.

* * * * *